United States Patent [19]

Cerofolini

[11] Patent Number: 4,468,852
[45] Date of Patent: Sep. 4, 1984

[54] PROCESS FOR MAKING CMOS FIELD-EFFECT TRANSISTORS WITH SELF-ALIGNED GUARD RINGS UTILIZING SPECIAL MASKING AND ION IMPLANTATION

[75] Inventor: Gianfranco Cerofolini, Milan, Italy

[73] Assignee: SGS-Ates Componenti Elettronici S.p.A., Agrate-Brianza, Italy

[21] Appl. No.: 482,156

[22] Filed: Apr. 5, 1983

[30] Foreign Application Priority Data

Apr. 8, 1982 [IT] Italy ................................ 20661 A/82

[51] Int. Cl.³ .................... H01L 21/22; H01L 21/265
[52] U.S. Cl. ..................................... 29/571; 29/576 B; 29/577 C; 29/578; 29/580; 148/1.5; 148/187; 148/190; 156/653; 156/657; 357/23; 357/42; 357/52
[58] Field of Search ................. 29/571, 576 B, 577 C, 29/578, 580; 148/1.5, 187, 190; 357/23 S, 23 CS, 42, 52; 156/653, 657

[56] References Cited

U.S. PATENT DOCUMENTS

| | | | |
|---|---|---|---|
| 3,983,620 | 10/1976 | Spadea | 29/578 X |
| 4,013,484 | 3/1977 | Boleky et al. | 148/1.5 |
| 4,110,899 | 9/1978 | Nagasawa et al. | 148/1.5 X |
| 4,131,907 | 12/1978 | Ouyang | 357/42 |
| 4,135,955 | 1/1979 | Gasner et al. | 148/187 |
| 4,268,321 | 5/1981 | Meguro | 29/571 X |
| 4,277,291 | 7/1981 | Cerofolini et al. | 148/1.5 |
| 4,282,648 | 8/1981 | Yu et al. | 29/571 |
| 4,285,116 | 8/1981 | Meguro | 29/576 B |
| 4,391,650 | 7/1983 | Pfeifer et al. | 148/1.5 |

OTHER PUBLICATIONS

Lilen, H., "Principes et Applications des CI/MOS", Editions Radio, Paris, France, 1972, pp. 54–59.

Primary Examiner—W. G. Saba
Attorney, Agent, or Firm—Karl F. Ross; Herbert Dubno

[57] ABSTRACT

Two patches of silicon nitride are formed above spaced-apart regions of an n-type substrate (2) on an overlying oxide layer (8) of small thickness. Arsenic ions are then implanted through the oxide layer in substrate areas not covered by the patches whereupon one patch (10a) and an adjoining portion of the oxide layer are covered by a masking layer (15) of polycrystalline silicon, leaving unprotected the second patch (10b) and an oxide portion adjacent thereto. The wafer is then bombarded with boron ions, first at a relatively low concentration and high energy level to penetrate the oxide layer as well as the second patch (10b) and then, after an intervening high-temperature heat treatment in a nonoxidizing atmosphere, at a relatively high concentration and low energy level. This results in the formation of a p-well (17) bounded by an n+ guard zone (23) and partly underreaching same, with an exposed area of that guard zone converted to p+ conductivity by the second-stage boron bombardment. A further heat treatment, at a somewhat lower temperature, expands the p+ area into a channel stop (21) of this conductivity type which bounds the p-well (17) but does not significantly encroach upon same. Removal of the polycrystalline silicon layer (15) is followed by the growth and partial removal of an oxide layer (8), by the deposition of polycrystalline silicon on residues (24a, 24b) of that layer to form insulated gates (26a, 26b), and by the formation of respective source and drain areas (30, 32 and 34, 36) on the p-well (17) and on an n-type pedestal (19) bounded by an n+ channel stop.

14 Claims, 10 Drawing Figures

PROCESS FOR MAKING CMOS FIELD-EFFECT TRANSISTORS WITH SELF-ALIGNED GUARD RINGS UTILIZING SPECIAL MASKING AND ION IMPLANTATION

FIELD OF THE INVENTION

My present invention relates to a process for making semiconductor structures including at least one pair of complementary MOS field-effect transistors (MOSFETs) generally known as CMOS FETs.

BACKGROUND OF THE INVENTION

CMOS FETs are useful as semiconductor switches operating at a relatively high voltage with low power consumption. According to conventional techniques, they are produced in a silicon substrate of one conductivity type (e.g. n) a region of which is subjected to implantation of impurities of the opposite conductivity type (p) to form a so-called well serving as the site of one of the two complementary FETs, specifically of the n-channel FET in the case of a p-well. An adjoining region of the original conductivity type then becomes the site of the other FET.

It is, of course, desirable that the two MOSFETs be spaced as closely as possible from one another and from other components of the same silicon wafer. In order to avoid undesirable interaction between such closely spaced components, it is known to separate them from one another by barriers which may be in the shape of surrounding guard rings or strips and which in the case of field-effect transistors are referred to as channel stops. These channel stops are generally of the same conductivity type as the adjoining substrate region carrying the protected MOSFET, but with a higher impurity concentration.

Commonly owned U.S. Pat. No. 4,277,291, applied for by me jointly with Giuseppe Ferla, discloses a process for the production of CMOS FETs with contiguous channel stops which, in contradistinction to earlier techniques, requires the formation of only one heavy oxide layer. According to the patented process, a first and a second patch of shielding material such as silicon nitride are formed on an oxide layer overlying a silicon substrate of one conductivity type, above spaced-apart first and second regions of that substrate, whereupon impurities of that one conductivity type are injected through the oxide layer into zones of the substrate immediately adjoining both regions, these zones including an intermediate section which separates the two regions from each other. Next, the first patch and an immediately adjoining first zone of the oxide layer—including a portion thereof overlying part of the intermediate section—are covered with a masking layer while the second patch and an immediately adjoining second zone of the oxide layer—including a portion thereof overlying another part of the intermediate section—are left uncovered. Impurities of the opposite conductivity type are then injected into the substrate through the second patch and through the second zone of the oxide layer in a quantity sufficient to overcompensate the effect of the impurities of the first-mentioned conductivity type which were previously injected through that second zone and to implant the impurities of the opposite conductivity type with a relatively high concentration in a substrate portion underlying that second zone and with a lower concentration in the second region bounded thereby. Following removal of the masking layer, the substrate is subjected to a heat treatment whereby the oxide layer already present thereon is caused to grow, especially in the areas free from the patches. Thereafter the two patches are removed together with underlying portions of the oxide layer so as to expose both the first and the second region of the substrate except for a residue of the oxide layer which extends across each of these regions to serve as an insulating gate support while dividing each region into source and drain areas. Finally, impurities of the first-mentioned conductivity type are introduced into the source and drain areas of the second region while impurities of the opposite conductivity type are introduced into corresponding areas of the first region.

As is known, the conduction threshold of a MOSFET is a function of the width of its channel relative to that of the overall transistor area. The process of the prior patent, while otherwise very useful, has the drawback of considerably restricting the relative width of that channel whose conductivity type is the same as that of the substrate (n in the embodiment specifically described in the patent). This is disadvantageous when a given wafer is to be provided with a maximum number of CMOS FETs each occupying only a small fraction of the available surface area. When such a wafer becomes part of an integrated circuit whose constituents vary widely in channel width and therefore in conduction threshold, the layout of that circuit is rather complex.

OBJECT OF THE INVENTION

Thus, the object of my present invention is to provide an improved version of the patented process which obviates this difficulty by providing a large ratio of effective channel width to overall width of the transistor.

SUMMARY OF THE INVENTION

I have found, in accordance with my present invention, that the restriction of the effective channel width observed in the prior process results from the manner in which the conductivity type of the aforementioned "second zone"—i.e. the one left uncovered by the masking layer applied after the first ion bombardment—is inverted by the subsequent bombardment with ions of the opposite conductivity type. The latter bombardment, whether carried out in one or in two stages, fails to establish a suitable boundary between the well of opposite conductivity type (p-well in the specific example) underlying the second patch and the adjoining channel stop of the same but enhanced conductivity type (p+) which, as now determined, encroaches on that well to a significant extent on account of the simultaneous or immediately consecutive injection of the same type of dopant—specifically acceptor atoms—into closely adjoining parts of the substrate.

Pursuant to the present improvement, the second injection of impurities proceeds again in two stages but with the first stage at higher intensity and with lower concentration than the second stage, the first of these stages enabling the injected impurities to penetrate the second patch and the adjoining second zone of the oxide layer in a quantity sufficient to produce the desired well of opposite conductivity type in the second region but insufficient to overbalance the impurity concentration in a substrate portion underlying the second layer zone which was enhanced by the first bombardment. This stage is followed by a first heat treatment in a nonoxidizing atmosphere at a high temperature and for a time sufficient to let the initially injected impurities diffuse to a predetermined extent into the first and second substrate regions while allowing the impurities last injected, of the opposite conductivity type, to diffuse deeper into the substrate. The second stage of injection of impurities of opposite-type conductivity inverts the conductivity of the substrate portion underlying the second zone of the oxide layer to an extent enhancing the impurity concentration of this substrate portion over that of the well previously produced while preserving the preponderance of impurities of the type corresponding to the initial bombardment—conforming to that of the substrate—in a substrate portion remote from that well to form a channel stop of the latter conductivity type next to a pedestal underneath the first patch having the conductivity of the substrate. The doping step forming the channel stop is therefore independent of the earlier injection used to produce the associated well. Thereafter, a second heat treatment at a temperature lower than that of the first heat treatment enables the impurities of the second-stage injection to diffuse to an extent expanding the area of enhanced opposite-type conductivity to the boundary of the well underlying the second patch, thereby forming another channel stop. This does not result in any significant reduction of the area of the well designed to accommodate the channel whose conductivity type matches that of the substrate. The remaining process steps, including thermal expansion of the oxide layer following the removal of the masking layer and the formation of source and drain areas in the first and second regions of the substrate, correspond to those of the prior patent.

The masking layer placed above the first patch and the adjoining first zone of the oxide layer, prior to the injection of ions of the opposite conductivity type (p in the specific example), must be capable of withstanding the temperature of the first heat treatment and preferably consists of polycrystalline silicon.

The second heat treatment may be carried out in a nonoxidizing atmosphere, like the first heat treatment, but could also be performed under oxidizing conditions and after removal of the masking layer so as to cause the aforementioned thermal expansion of the oxide layer.

BRIEF DESCRIPTION OF THE DRAWING

My invention will now be described in greater detail with reference to the accompanying drawing in which.

SPECIFIC DESCRIPTION

The following description of FIGS. 1–4 is essentially a recapitulation of the disclosure of the prior U.S. Pat. No. 4,277,291.

Figure 1:
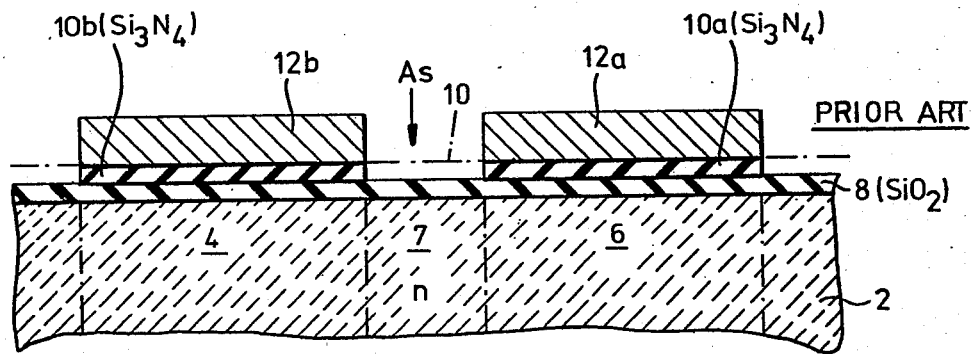
FIGS. 1–4 are cross-sectional views of a representative portion of a silicon wafer and substantially conform to FIGS. 1–3 and 6 of U.S. Pat. No. 4,277,291, thus representing the state of the art.

FIG. 1 shows a substrate 2 of essentially monocrystalline n-type silicon overlain by a thin layer 8 of silicon dioxide. The illustrated portion of substrate 2 forms part of a larger wafer in which one or more pairs of complementary MOSFETs are to be produced, possibly along with other kinds of semiconductor components. The substrate includes two regions 4 and 6 respectively allocated to an n-channel and a p-channel field-effect transistor; these regions are separated by an intermediate section 7 providing space for the associated channel stops. The wafer may have a resistivity of about 4 ohm.cm.

Oxide layer 8 is covered above region 6 by a first patch $10a$ of shielding material $Si_3N_4$ topped by a mask $12a$ photoresist; a second $Si_3N_4$ patch $10b$ with a photoresist mask $12b$ is located on the oxide layer above region 4. The patches $10a$ and $10b$ are originally part of a layer 10 coextensive with oxide layer 8, overlying the entire wafer; the removal of part of this layer 10 above the intermediate section 7 and other portions of the substrate is carried out in the well-known manner after selective destruction of the originally coextensive photoresist deposit by the usual photolithographic procedures. The $SiO_2$ layer 8 may have a thickness of about 300 Å while that of the $Si_3N_4$ layer 10 may be approximately 1,000 Å.

The wafer is then subjected to a bombardment by arsenic ions which penetrate the uncovered portions of the oxide layer 8 and increase the concentration of n-type impurities in the underlying substrate zones. If the patches $10a$, $10b$ are strips extending parallel to each other across the wafer, these uncovered portions and the resulting zones of n+ conductivity will also be parallel strips; otherwise, they may form rings or frames (cf. FIG. 5) around the patches and the underlying regions 4 and 6, separating them from each other and from further components in both the longitudinal and the transverse dimensions of the wafer. The As ions used for this implantation step may be injected with an energy level of 50 KeV and in a sufficient quantity to provide a doping level of about $5 \cdot 10^{11}/cm^2$ in the zones immediately below the oxide layer. The surface portion of substrate 2 initially permeated by these n+ impurities is relatively shallow and has been indicated at 13 in FIG. 2.

Figure 2:
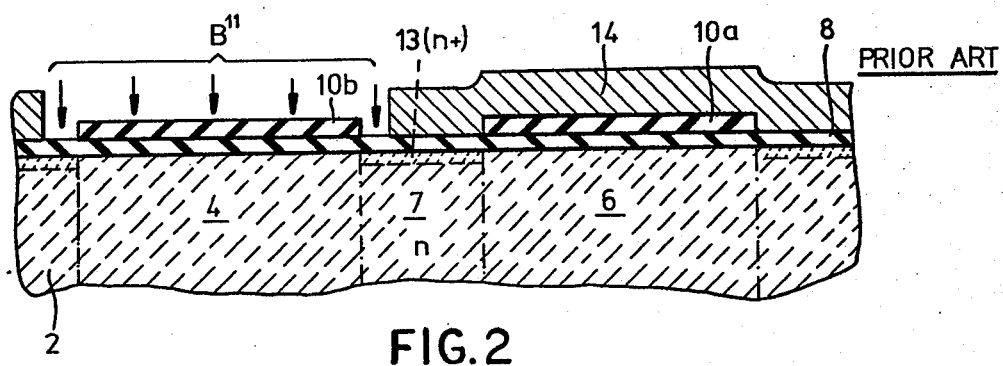

The photoresist masks $12a$ and $12b$ (together with their counterparts elsewhere on the wafer) are then removed whereupon another such mask 14, shown in FIG. 2, is formed above the patch $10a$ and adjoining portions of layer 8, overhanging a major part but not all of the intermediate section 7. This leaves uncovered the patch $10b$ and immediately adjoining oxide portions, one of them extending above a minor part of intermediate section 7. Next, the wafer is bombarded by ions of boron $B^{11}$ of such energy and in such quantity as to pass not only through the uncovered zones of the oxide layer but also through the patch $10b$ to reverse the conductivity type of the underlying substrate portions, including those in which arsenic ions were previously implanted. This leads to the formation of a p-well 18 (FIG. 3) surrounded or otherwise bounded by a zone or zones 20 of p+ conductivity constituting a channel stop for the n-channel MOSFET to be produced. The prior patent mentions the possibility of achieving such an impurity distribution in a single implantation step but particularly describes an injection of these p type impurities in two stages, one of them with an energy level (e.g. of 30 KeV) insufficient to penetrate the patch $10b$ so that only the adjoining uncovered zones of oxide layer 8 are traversed by the ions to overbalance the previously implanted n-type impurities, the other stage using an energy level (e.g. of 100 KeV) enabling penetration of both the Si$_3$N$_4$ patch 10b and the underlying oxide. The concentration of p-type impurities in the guard zone 20 resulting from the low-energy bombardment may be about 10$^{12}$/cm$^2$.

Figure 3:
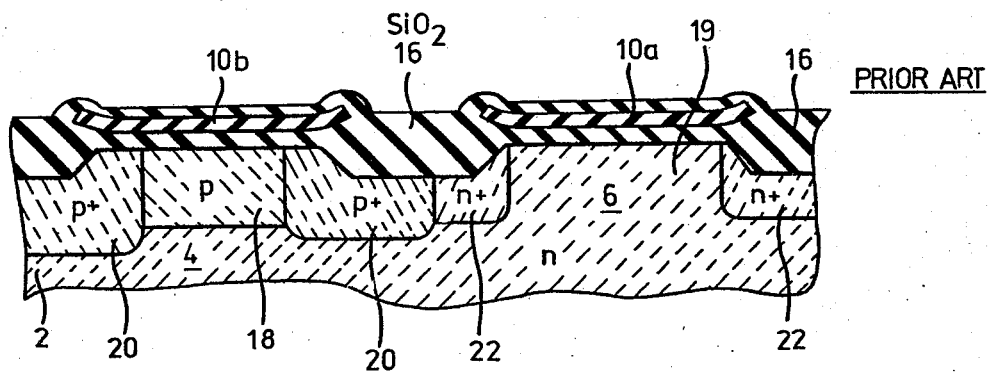
Figure 4:
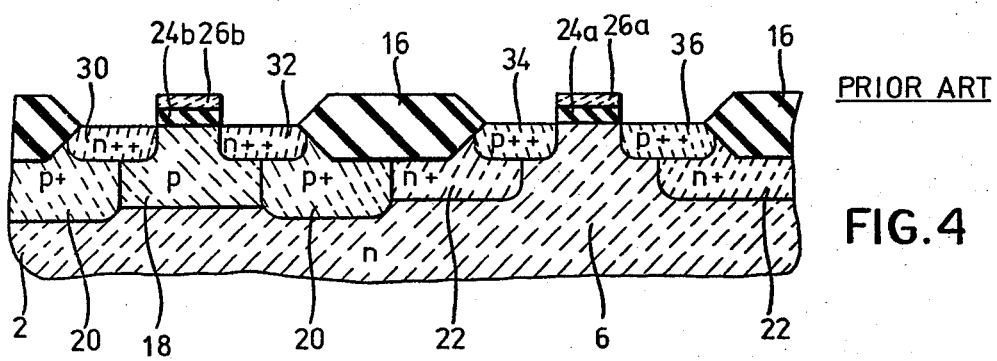

The p-type impurities thus implanted in substrate region 4 and its immediate vicinity do not initially occupy the substrate portions 18 and 20 shown in FIG. 3 but diffuse into them only gradually, particularly during a subsequent heat treatment to which the wafer is subjected after removal of the mask 14. The treatment step, in which the wafer is maintained at a temperature of about 900° C., also serves as a drive-in operation in which not only the boron ions in and around region 4 but also the arsenic ions around region 6 penetrate further into the substrate, the latter ions thus forming a guard zone 22 constituting a channel stop for the p-channel MOSFET to be produced. The heat treatment in an oxidizing atmosphere results in a growth of the layer 8, predominantly in areas free from patches 10a and 10b, to a thickness of about 10,000 Å whereby heavy barriers 16 are formed above guard zones 20 and 22. The barriers 16 remain essentially intact upon the subsequent removal of the remainder of the oxide layer, along with patches 10a and 10b, except for a pair of strips 24a, 24b respectively bisecting the well 18 in region 4 and an exposed predestal 19 forming part of region 6; these oxide strips 24a and 24b are covered, in conventional manner, by respective deposits 26a and 26b of polycrystalline silicon to form insulated gates for the two complementary MOSFETs. Thereafter, well 18 together with gate 26b and its insulating support 24b is covered by a stratum of silicon dioxide heavily doped with n+ impurities, e.g. phosphorus ions. When the wafer is then subjected to an elevated temperature in a boron atmosphere, phosphorus ions are transferred from the doped stratum to source and drain areas of p-well 18 on opposite sides of oxide strip 24b while at the same time there occurs a diffusion of boron ions into corresponding areas of pedestal 19 separated by oxide strip 24a. The phosphorus-doped oxide stratum shields the p-well 18 from the boron ions during this operation. Thus, as shown in FIG. 4, there are obtained islands 30 and 32 of n++ conductivity type, representing the source and the drain of an n-channel MOSFET, along with islands 34 and 36 of p++ conductivity type, representing the source and the drain of a p-channel MOSFET. These MOSFETs are subsequently completed by the deposition of metallic electrodes on their active elements, i.e. on the source and drain areas as well as on the insulated gates 26a, 26b.

Figure 5:
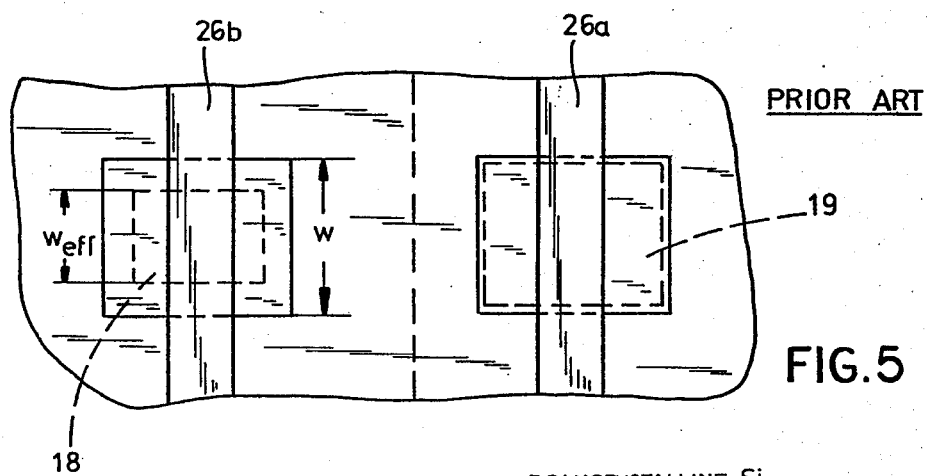
FIG. 5 is a plan view of the wafer portion shown in FIG. 4.
Figure 6:
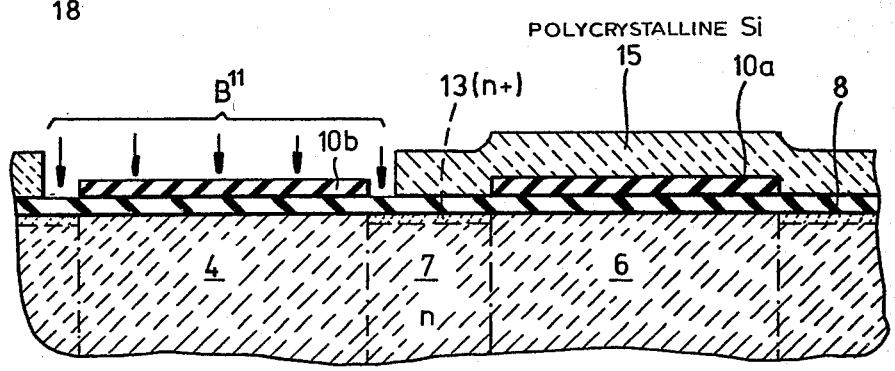
FIGS. 6–9 are cross-sectional views similar to FIGS. 1–4, illustrating the improved process according to my present invention.

As will be apparent from a comparison of present FIGS. 3 and 4 with FIGS. 3 and 6 of the prior patent, guard zones 20 and 22 have been found to encroach upon p-well 18 and pedestal 19 somewhat farther than was originally assumed. This encroachment, due to the aforedescribed diffusion of p-type impurities, is particularly significant in the case of the n-channel MOSFET including the well 18 and, as illustrated in FIG. 5, results in an effective channel width w$_{eff}$ which is considerably less than the overall width w of the MOSFET itself.

In order to increase the ratio w$_{eff}$/w, the process steps described with reference to FIGS. 1–4—corresponding to those known from the prior patent—are modified in accordance with FIGS. 6–10 as discussed hereinafter.

FIG. 6 substantially duplicates FIG. 2, except for the use of a more highly heat-resistant masking layer 15 of polycrystalline silicon replacing the layer 14. This layer, conventionally obtained from silane by chemical-vapor deposition (CVD) at about 600° C., has a thickness of approximately 6,000 Å and covers the same parts of oxide layer 8 as does the masking layer 14 of FIG. 2. The wafer is then subjected to bombardment with B$^{11}$ ions at a relatively elevated intensity, of about 100 KeV, but of rather low concentration so that only the previously shielded region 4 acquires p-type conductivity to form a well 17 shown in FIG. 7 as the ions penetrate the stack 8, 10b. The zones previously exposed to As injection, including intermediate section 7, retain their n+ character.

The wafer so treated is heated to a temperature of about 1,200° C. in a nonoxidizing atmosphere and for a certain time, readily determinable by tests on a suitable prototype, which allows the initially injected donor ions to spread from their original locations (indicated by dashed lines in FIG. 6) into adjacent areas partly extending below patches 10a and 10b. This results in the formation of n+ enclaves 23 which in turn are partly underlain by extensions of p-well 17 whose acceptor ions also diffuse deeper into the substrate 2. It will be noted that each n+ enclave 23 has its center offset from an injection gap 25 formed between a patch 10b and an adjoining masking layer 15 which, of course, is duplicated a number of times on the surface of substrate 2. The virtually symmetrical growth of each n+ enclave 23 results in substantially identical dimensions for the p-well 17 and a pedestal 19 of n-conductivity formed, as in FIG. 3, beneath the patch 10a.

Figure 7:
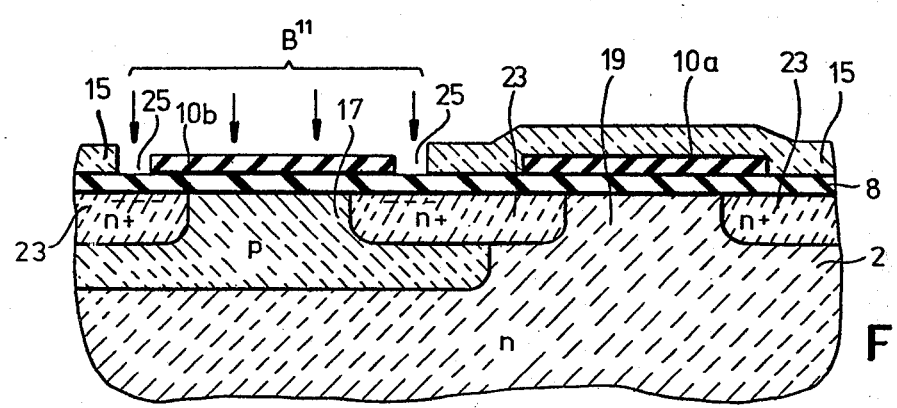
Figure 8:
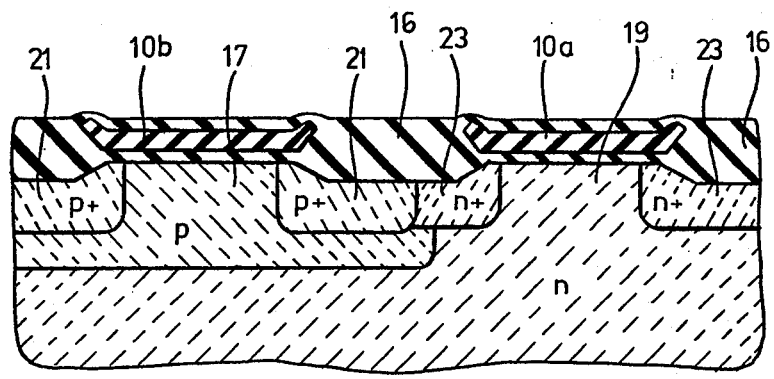

Next, as indicated by dashed lines in FIG. 7, boron ions are injected through the gaps 25 and the oxide layer 8 into each enclave 23 at low energy, e.g. about 30 KeV, but with an elevated concentration so as to invert the conductivity type of enclaves 23 in the vicinity of these gaps. The low-energy ions do not penetrate the patch 10b or the layer 15. A subsequent heat treatment at a somewhat lower temperature than before, e.g. 950° C., lets the injected boron ions spread symmetrically within each enclave 23 to form therein a p+ guard zone 21 bounding the p-well 17, as shown in FIG. 8, while leaving the enclaves partly intact as an n+ guard zone or channel stop 22 bounding the n-pedestal 19. This second heat treatment may be carried out after removal of silicon layer 15, and in an oxidizing atmosphere, to cause a growth of oxide layer 8 into a heavier stratum, forming barriers 16 with a thickness of about 10,000 Å between patches 10a and 10b, similar to that shown in FIG. 3. Alternatively, the thickening of oxide layer 8 may be achieved by a further heat treatment of about 900° C., with masking layer 15 left in place until after thermal diffusion of the boron ions injected into enclaves 23. The p/n junction existing at the boundary of each enclave 23 with the expanded adjoining well 17 prevents any significant encroachment of the p+ zone 21 on that well—as will be apparent from a comparison of FIGS. 7 and 8—whose dimensions, therefore, are essentially determined by the heat treatment described with reference to FIG. 7.

Figure 9:
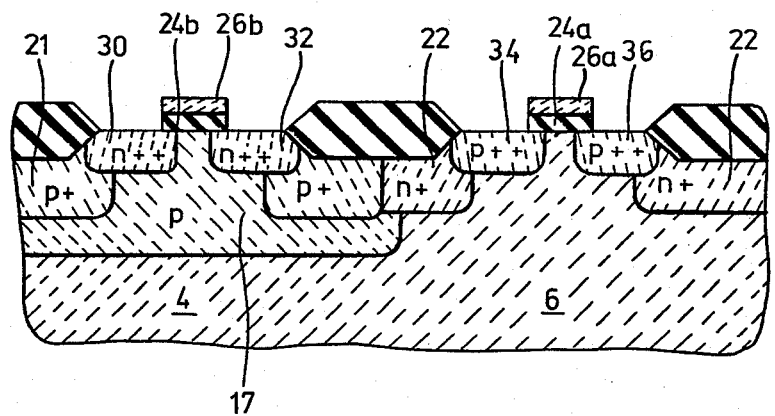
Figure 10:
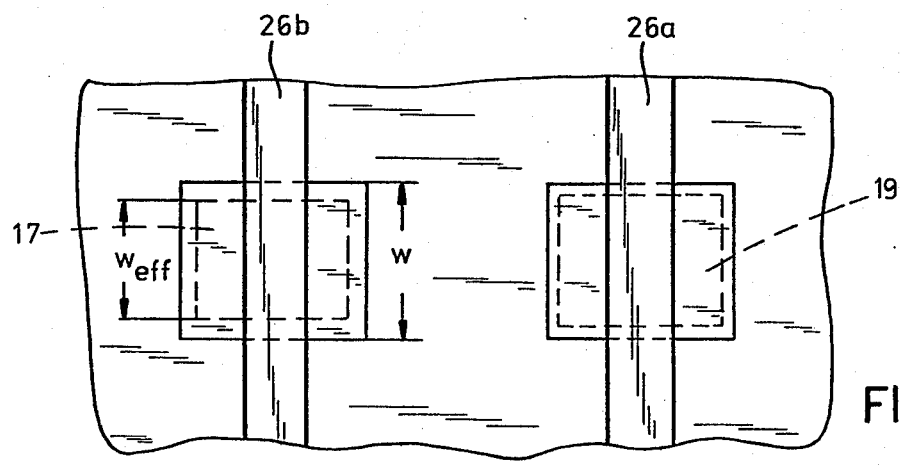
FIG. 10 is a plan view similar to FIG. 5 but pertaining to the wafer portion shown in FIG. 9.

The following operations, corresponding to those described in the prior patent, include the partial removal of layer 16 to leave oxide strips 24a and 24b topped by deposits 26a and 26b of polycrystalline silicon to form insulated gates for the two complementary MOSFETs. Suitable doping of the areas of p-well 17 and n-pedestal 19 adjacent these oxide strips produces islands 30 and 32 of n++ conductivity, constituting the source and the drain of an n-channel MOSFET, as well as islands 34 and 36 of p++ conductivity, constituting the source and the drain of a p-channel MOSFET. The resulting structure, shown in FIG. 9, is similar to that of FIG. 4 except that the dimensions of p-well 17, approximately conforming to those of n-pedestal 19, are larger than those of p-well 18 of the earlier structure. Thus, the effective channel width $w'_{eff}$ shown in FIG. 10 substantially exceeds the corresponding width $w_{eff}$ indicated in FIG. 5 for an identical overall width w.

The impurity concentrations is the doped zones of FIG. 9 are substantially the same as in corresponding zones of FIG. 4.

I claim:

1. A process for making complementary MOS field-effect transistors with contiguous channel stops in a silicon substrate of one conductivity type overlain by an oxide layer, comprising the steps of:
   (a) forming a first and a second patch of shielding material on said oxide layer above spaced-apart first and second regions of said substrate;
   (b) injecting first impurities of said one conductivity type through said oxide layer into zones of said substrate immediately adjoining said first and second regions, including an intermediate section separating said first and second regions, thereby enhancing the conductivity of said zones over that of said substrate;
   (c) covering said first patch and at least one immediately adjoining first zone of said oxide layer, including a portion thereof overlying part of said intermediate section, with a masking layer while leaving uncovered said second patch and at least one immediately adjoining second zone of said oxide layer, including a portion thereof overlying another part of said intermediate section;
   (d) injecting second impurities of the opposite conductivity type through said second patch and through said second zone in a quantity sufficient to produce a well of said opposite conductivity type in said second region but insufficient to invert the conductivity in a substrate portion underlying said second zone enhanced by the first impurities injected in step (b);
   (e) subjecting said substrate to a first heat treatment in a nonoxidizing atmosphere at a high temperature and for a time sufficient to let the first impurities injected in step (b) diffuse to a predetermined extent into said first and second regions while letting the second impurities of said second region diffuse deeper into the substrate;
   (f) injecting more of said second impurities into said underlying substrate portion in a quantity sufficient to impart thereto a conductivity of inverted type enhanced over that of said second region while preserving the enhanced nonverted conductivity of a substrate portion in the vicinity of said first region to leave a channel stop of said one conductivity type next to a pedestal of substrate conductivity beneath said first patch;
   (g) subjecting said substrate to a second heat treatment at a temperature lower than that of said first heat treatment in step (e) and for a time enabling the impurities injected in step (f) to diffuse to an extent expanding the area of enhanced conductivity to the boundary of the well produced in step (d), thereby forming a second channel stop of said opposite conductivity type next to said well beneath said second patch;
   (h) thermally expanding said oxide layer, following removal of said masking layer, predominantly in areas free from said patches;
   (i) removing said patches together with underlying portions of said oxide layer, thereby opposing said first and second regions except for a residue of said oxide layer extending across each of said regions and dividing same into source and drain areas while forming an insulating gate support; and
   (j) introducing impurities of said one conductivity type and of said opposite conductivity type into the source and drain areas of said second and said first region, respectively.

2. A process as defined in claim 1 wherein said masking layer is formed of polycrystalline silicon.

3. A process as defined in claim 1 wherein said shielding material is silicon nitride.

4. A process as defined in claim 1 wherein said second heat treatment in step (g) is performed in an oxidizing atmosphere and after removal of said masking layer to cause the thermal expansion of said oxide layer of step (h).

5. A process as defined in claim 1 wherein said first and second impurities are of n type and p type, respectively.

6. A process as defined in claim 2 wherein said shielding material is silicon nitride.

7. A process as defined in claim 2 wherein said second heat treatment in step (g) is performed in an oxidizing atmosphere and after removal of said masking layer to cause the thermal expansion of said oxide layer of step (h).

8. A process as defined in claim 2 wherein said first and second impurities are of n type and p type, respectively.

9. A process for making complementary MOS field-effect transistors with contiguous channel stops in a silicon substrate of one conductivity type, comprising the steps of:
   (a) forming a first and a second patch of shielding material on an oxide layer above spaced-apart first and second regions of said substrate;
   (b) injecting first impurities of said one conductivity type into zones of said substrate immediately adjoining said first and second regions, including an intermediate section separating said first and second regions, thereby enhancing the conductivity of said zones over that of said substrate;
   (c) covering said first patch and at least one immediately adjoining first part of said intermediate section with a masking layer while leaving uncovered said second patch and at least one immediately adjoining second part of said intermediate section;
   (d) injecting second impurities of the opposite conductivity type into substrate portions not covered by said masking layer in a quantity sufficient to produce a well of said opposite conductivity type in said second region but insufficient to invert the conductivity in said second part of said intermediate section enhanced by the first impurities injected in step (b);
   (e) subjecting said substrate to a first heat treatment in a nonoxidizing atmosphere at a high temperature and for a time sufficient to let the first impurities injected in step (b) diffuse to a predetermined extent into said first and second regions while letting the second impurities of said second region diffuse deeper into the substrate;

(f) injecting more of said second impurities into said second part of said intermediate section in a quantity sufficient to impart thereto a conductivity of inverted type enhanced over that of said second region while preserving the enhanced noninverted conductivity of a substrate portion in the vicinity of said first region to leave a channel stop of said one conductivity type next to a pedestal of substrate conductivity beneath said first patch;

(g) subjecting said substrate to a second heat treatment at a temperature lower than that of said first heat treatment in step (e) and for a time enabling the impurities injected in step (f) to duffuse to an extent expanding the area of enhanced conductivity to the boundary of the well produced in step (d), thereby forming a second channel stop of said opposite conductivity type next to said well beneath said second patch;

(h) removing said masking layer;

(i) removing said patches together with underlying portions of said oxide layer, thereby exposing said first and second regions except for a residue of said oxide layer extending across each of said regions and dividing same into source and drain areas while forming an insulating gate support; and (j) introducing impurities of said one conductivity type and of said opposite conductivity type into the source and drain areas of said second and said first region, respectively.

10. A process as defined in claim 9 wherein said masking layer is formed of polycrystalline silicon.

11. A process as defined in claim 9 wherein said shielding material is silicon nitride.

12. A process as defined in claim 9 wherein said first and second impurities are of n type and p type, respectively.

13. A process as defined in claim 10 wherein said shielding material is silicon nitride.

14. A process as defined in claim 10 wherein said first and second impurities are of n type and p type, respectively.

* * * * *